United States Patent [19]

Vig

[11] Patent Number: 5,604,392
[45] Date of Patent: Feb. 18, 1997

[54] LEVITATED CRYSTAL RESONATOR

[75] Inventor: John R. Vig, Colts Neck, N.J.

[73] Assignee: The United States of America as represented by the Secretary of the Army, Washington, D.C.

[21] Appl. No.: 439,745

[22] Filed: May 12, 1995

[51] Int. Cl.⁶ .................................................. H01L 41/08
[52] U.S. Cl. ......................... 310/309; 310/311; 310/317; 310/366
[58] Field of Search .................................... 310/309, 311, 310/369, 317, 344, 365, 366

[56] References Cited

U.S. PATENT DOCUMENTS

| Re. 26,707 | 11/1967 | Hammond et al. |  |
|---|---|---|---|
| 1,836,735 | 12/1931 | Tillyer | 310/344 |
| 1,898,599 | 2/1933 | Schröter | 310/344 |
| 3,339,091 | 8/1964 | Hammond et al. |  |
| 4,012,700 | 3/1977 | Besson | 310/348 |
| 4,259,606 | 3/1981 | Vig. |  |
| 5,015,906 | 5/1991 | Cho et al. |  |
| 5,124,879 | 6/1992 | Goto | 310/309 |
| 5,187,399 | 2/1993 | Carr et al. | 310/309 |
| 5,488,333 | 1/1996 | Vig | 331/66 |

OTHER PUBLICATIONS

Besson, "A New Piezoelectric Resonator Design", Proceedings of the 30th Annual Frequency Control Symposium, pp. 78–83, 1976.

U.S. Patent Application Serial No. 08/397,698, filed Mar. 1, 1995, entitled "High Sensitivity Temperature Sensor and Sensor Array" by John R. Vig.

Primary Examiner—Thomas M. Dougherty
Attorney, Agent, or Firm—Michael Zelenka; William H. Anderson

[57] ABSTRACT

A crystal resonator in an electrodeless configuration is electrically levitated by a resonant circuit. A quartz plate (or other piezoelectric substrate) is levitated by a resonant circuit which includes an inductor that is external to a housing and a parallel plate capacitor that is inside the housing. The parallel plate capacitor consists of three plates, two of which are mounted edge to edge on a nonconductive housing with a small space between them and the third of which is a conducting surface on the quartz plate being levitated. This is an open circuit configuration which requires no feedback sensor circuitry. The resonator, after being levitated, is then electrically addressed in any number of electrodeless configurations.

17 Claims, 3 Drawing Sheets

(Prior Art)

LEVITATED CRYSTAL RESONATOR

GOVERNMENT INTEREST

The invention described herein may be made, used, sold and/or licensed by, or on behalf of, the United States of America without the payment to me of any royalties thereon.

FIELD OF THE INVENTION

The present invention relates to the field of quartz resonators and, in particular, it relates to an electrodeless, levitated crystal resonator.

BACKGROUND OF THE INVENTION

Oscillators based on crystal resonators have been well known for several decades. Such devices have revolutionized several different technologies such as frequency control devices, thermometers and precision time pieces. However, the performance of all crystal resonators are limited by several different environmental conditions; these conditions include temperature, pressure, acceleration, radiation, time, electromagnetic energy, and humidity. To compensate for effects that these environmental conditions cause in the performance of the crystal resonator, several different variations of crystal resonators have been developed. Examples of these developments include ovenized oscillators, specially cut crystal resonators, various resonator mounting configurations, as well as various electrode configurations.

One well known electrode configuration, which is material to the present invention, is an "electrodeless" configuration wherein the electrodes used to excite the crystal do not physically contact the crystal, that is, there is a gap between the crystal and the electrode. This type of configuration is beneficial because the use of the gap between the electrodes and the crystal reduces the instabilities associated with changes in electrode stresses and at the electrode-quartz interface and therefore, a very high precision and stability can be achieved. This type of electrode configuration is more fully described in U.S. Pat. No. 3,339,091, issued to Hammond et al on Aug. 29, 1964 and U.S. Pat. No. Re. 26,707, issued on Nov. 4, 1967, both of which are incorporated by reference hereto. Other related improvements to this electrode configuration are found in such articles as "A New Piezoelectric Resonator Design," Besson, Proceedings of the 30$^{th}$ Annual Frequency Control Symposium, pp. 78–83, 1976, which describes an electrodeless "BVA" configuration. One problem with these "electrodeless" configurations, however, is that they still must be mechanically mounted and bonded to a support structure. In so mounting the resonators, the resonators are still subject to stress related instabilities.

The present invention addresses this problem.

SUMMARY OF THE INVENTION

Accordingly, one object of the present invention is to minimize instabilities in crystal resonators caused by mechanical stresses.

Another objective Of the present invention is to provide such a resonator which can be readily incorporated into conventional circuitry.

These and other objects of the present invention are accomplished by electrically levitating a crystal resonator and exciting the resonator in an electrodeless configuration. In one generic embodiment of the present invention, a quartz plate (or other piezoelectric plate) is levitated by a resonant circuit which includes an inductor that is usually external to a housing and a parallel plate capacitor at least one plate of which is usually inside the housing. The parallel plate capacitor consists of three plates, two of which are mounted edge to edge on a nonconductive housing with a small space between them and the third of which is a conducting surface on the resonator plate being levitated. This is a circuit configuration which requires no feedback sensor circuitry. Such a circuit is described in U.S. Pat. No. 5,015,906, issued to Cho et al on May 14, 1991, which is incorporated herein by reference. The resonator, after being levitated, is then electrically excited in any number of electrodeless or lateral field configurations known in the art.

As those skilled in the art will recognize from this disclosure, other methods of levitating and stabilizing the resonator are also possible. For example, multiple sets of plate capacitors can be used to achieve stability in six degrees of freedom.

BRIEF DESCRIPTION OF THE DRAWINGS

These and other features of the invention will become more apparent in light of the following Detailed Description of the Invention and the attached drawings wherein.

DETAILED DESCRIPTION OF THE INVENTION

Figure 1:
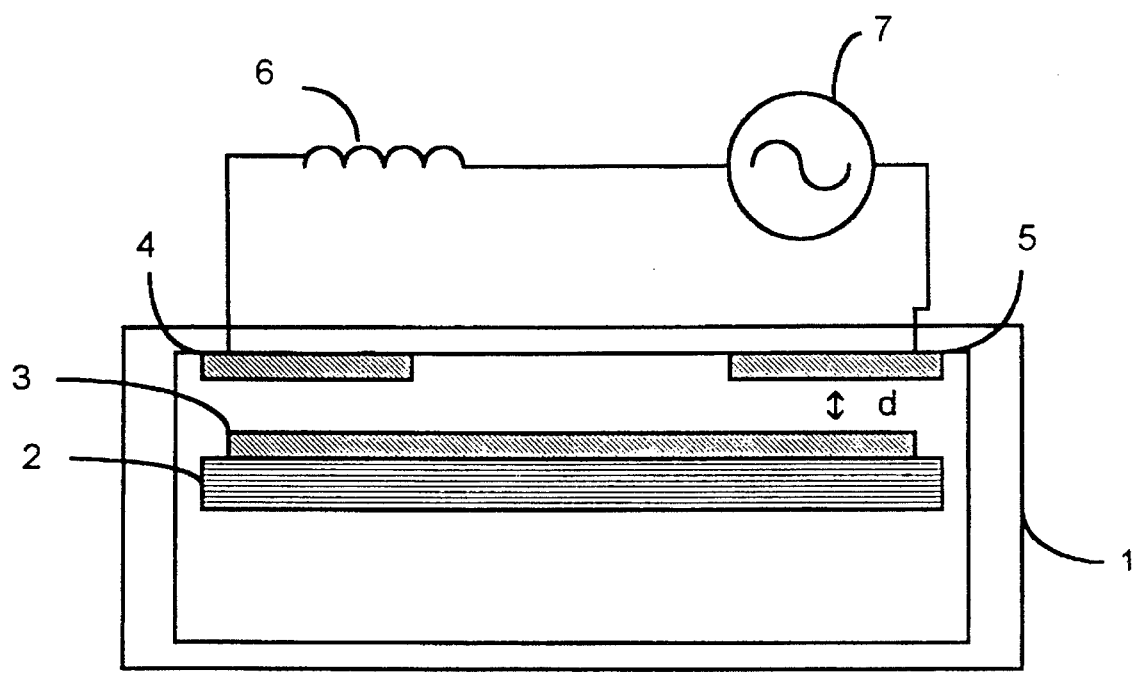
FIG. 1 is a levitating device which is described in prior art.

FIG. 1 is a diagrammatic/cross-section view of a levitation device similar to that found in the prior art. Specifically, U.S. Pat. No. 5,015,906, issued to Cho et al on May 14, 1991, which is incorporated herein by reference, describes a method and apparatus for levitating an element of a micromechanical device. This device uses a resonant circuit which includes an inductor 6 that is usually external to a housing 1 and a parallel plate capacitor 3, 4, and 5 that is inside the housing 1. The parallel plate capacitor consists of three plates 3, 4, and 5, two of which (4 and 5) are mounted edge to edge on the housing with a small space between them and the third (3) of which is a conducting surface on the levitated plate 2. This structure forms an LC resonant circuit such that when a voltage is applied by oscillator circuit 7 to the plate capacitors 4 and 5 on the housing 1 at a frequency slightly greater than the natural frequency of the resonant circuit, not only is the plate 2 levitated, but a "restoring force" is also achieved. Thus, this is an open circuit configuration which requires no feedback sensor circuitry. So that when the plate 2 is moved either upward or downward while being levitated, the restoring force of the resonant circuit will keep the plate 2 from contacting the housing 1. The single resonant circuit establishes a potential well in the vertical direction so that the resonator plate 2 is confined in a space similar to the type confinement used for ion traps. Further, it has been shown by Cho et al that for a flat plate with four sets of levitation electrodes, it is possible to obtain stability in all six degrees of freedom required for a rigid body.

Figure 2:
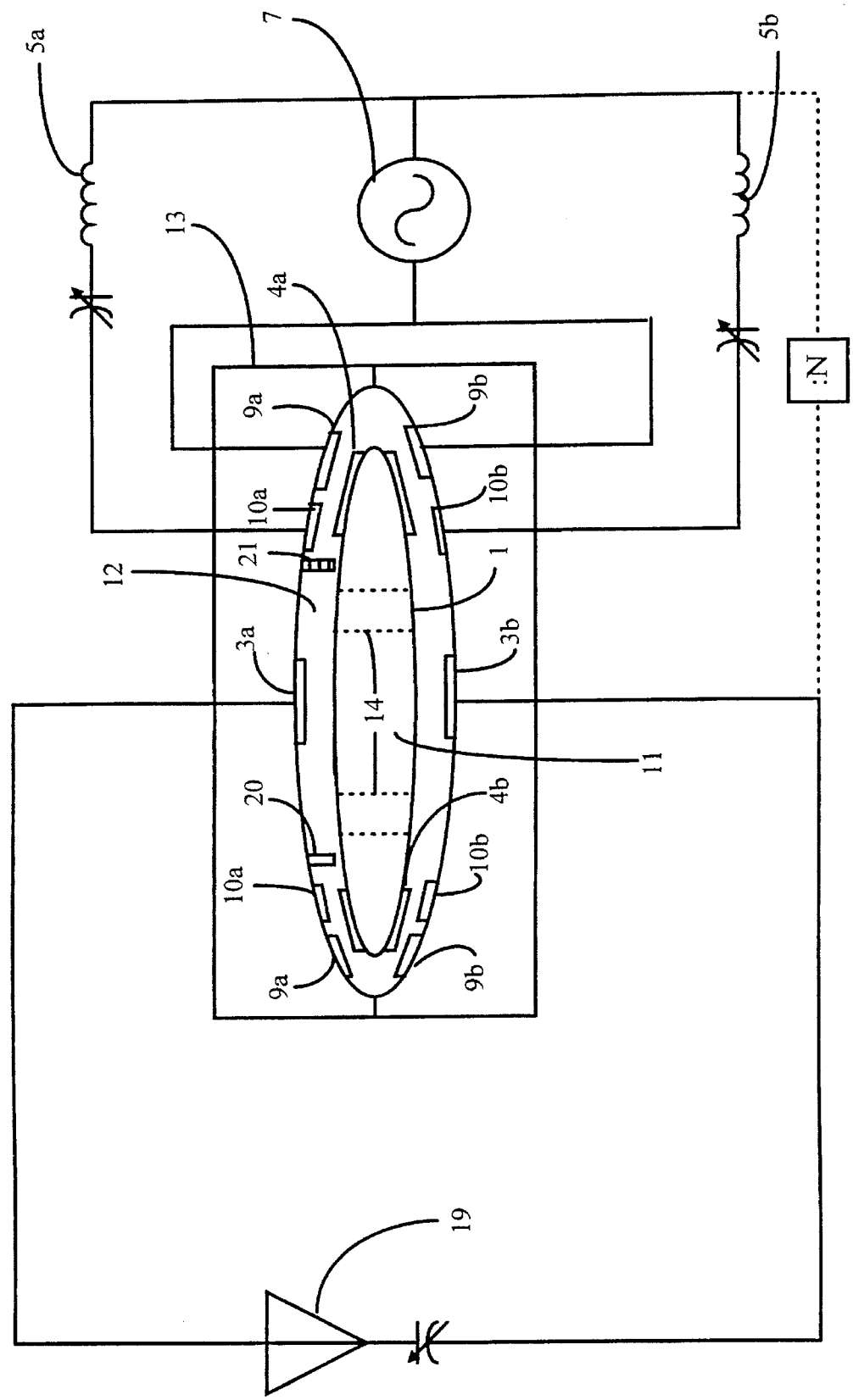
FIG. 2 is a cross-section view of one preferred embodiment of the present invention.
Figure 3:
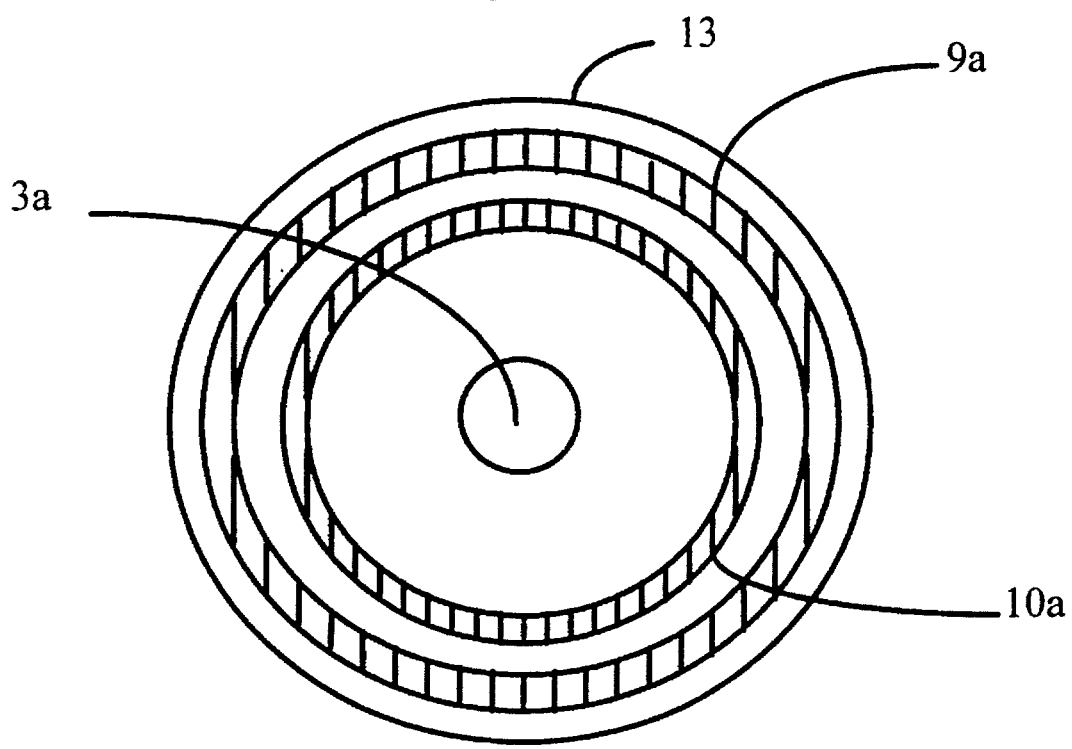
FIG. 3 is a view of the electrode configuration for the surface of the housing in FIG. 2.

In FIGS. 2 and 3 there is shown one preferred embodiment of the present invention. As shown, a BVA style or electrodeless resonator 1 is levitated utilizing two LC resonant circuits as described above, but with ring shaped capacitor elements (as shown in FIG. 3) mounted on the housing and the resonator. The resonator according to the present invention can be any type of resonator used in the art, such as crystals of any cut and orientation of quartz, langasite, lithium tetraborate, lithium tantalate, sapphire, etc., or resonators formed of ceramics or other piezoelectric materials. The preferred shape of the resonator plate is circular and biconvex, however, the shape may also be plano-convex, plano-plano, and rectangular. The levitation may also be used with lateral field and conventional thickness field resonators. The electrical leads to the electrodes then can be very thin conducting wires or ribbons, for example. The lateral field resonator may be excited with either one pair of electrodes on one major surface of the resonator or with two pairs of electrodes on either of the two major surfaces of the resonator.

As shown, the resonator 1 is disposed within a cavity 12 of housing 13. Two ring shaped levitation electrodes 9a and 10a are mounted on a top surface 2 of the cavity 12 and two ring shaped levitation electrodes 9b and 10b are mounted on a bottom surface of the cavity 12. Two more ring shaped levitation electrodes 4a and 4b are mounted on resonator 1 preferably on an area outside the active region 11 of the resonator which may be separated by quartz bridges (as represented by dashed lines 14). The levitation electrodes 9a and b and 10a and b are electrically connected to inductors 5a and 5b, respectively, which are both connected to levitation signal source 7. An alternative method of providing a signal to the levitation circuit is to derive the signal from the oscillator circuit 19, for example, by dividing down the oscillator frequency to the levitation frequency, as indicated by the dashed line and the ":N" block.

The active region 11 of the resonator is vibrated/excited by an oscillator circuit 19. As shown in FIG. 2, electrodes 3a and 3b are mounted on the top and bottom surfaces of the cavity and are electrically connected to an oscillator circuit 19 (represented by an amplifier and tuning element). The resonator is operated in a manner similar to that explained in U.S. Pat. No. 3,339,091, issued to Hammond et al on Aug. 29, 1965, which is incorporated herein by reference. Of course, as those skilled in the art will readily recognize given this disclosure, any number of BVA type or electrodeless circuit configurations are possible.

As shown, however, in order to eliminate any mechanical stresses on the resonator, the ring shaped levitation electrodes should be mounted near an outer, inactive region of the resonator and the inactive region, i.e. an outer edge, may be isolated from the active region by a ring shaped "bridge," shown as dashed lines 14. The use of such isolation "bridges" is well known in the art and therefore, need not be explained further.

The ring electrodes 9 a and b, 10 a and b, and 4 a and b form a parallel plate capacitor as described in Cho et al. Together with the inductors 5 a and b and oscillator 7, a LC resonant circuit is formed. In operation, the resonator is levitated by applying a voltage to the ring shaped electrodes 9a and b at a frequency greater than the natural frequency of the resonant circuit as described in Cho et al. With the two sets of plate capacitors and inductors, six degrees of stability is achieved. Once the resonator is levitated, the resonator is vibrated/excited by oscillator circuit 19.

Considering now the dimensions of the device, for a capacitor plate area A and a driving voltage V, the vertical levitation force F is proportional to $AV^2d^{-2}$, where d is the distance between the plate and the electrodes that are mounted to the housing. Accordingly, a typical 10 MHz $3^{rd}$ overtone SC-cut resonator may be levitated at a gap of a few micrometers with a voltage of approximately 10 V. In currently used electrodeless (BVA) resonators, the gap between the electrodes and the resonator plate is usually 5 μm and the next generation BVA resonators are expected to use only about 1 μm. Therefore, the BVA gap dimensions are highly compatible with the dimensions needed for levitation at reasonable voltages. Moreover, the frequency of an electrodeless resonator depends only on the sum of two gaps and thus a slight displacement of the resonator in the gaps will not affect the frequency output of the resonator. For example, if two equal gaps of 5 μm are changed to 4 μm gap on one side and 6 μm on the other side, then the sum is the same and the frequency will not be affected. Therefore, displacements in the gap due to shock and vibration do not affect the oscillator frequency as long as the displacement is not so large as to cause the resonator plate to bump against a wall of the enclosure. In order to protect the resonator against such possible bumps, and also during periods when the levitation circuitry is off, one may protect the resonator by placing small bumpers 20 or 21 on the walls of the enclosure such that the resonator plate can touch these bumpers only outside the active region 11. The bumpers may be, for example, micromechanical springs 21 or dimples 20.

A further advantage of levitating the resonator, other than eliminating the mechanical stresses on the resonator, is that, when the resonator is sealed in an ultrahigh vacuum, heat losses from the resonator are limited to radiation losses. The amount of energy needed to heat the resonator to the turnover temperature is small, and the thermal time constant for heating the resonator to its turnover temperature is short. Therefore, when the resonator is heated in the thickness direction by infrared radiation, as for example described in U.S. Pat. No. 4,259,606, which is incorporated herein by reference, the time constant is a fraction of a second even for a 5 MHz $5^{th}$ overtone SC-cut resonator. The time constant is proportional to the square of the plate thickness and therefore, the time constant for warmup can be in the milliseconds for high frequency resonators, whereas the time constant for cooling is much longer due to the small thermal conductance to the outside. Therefore, such a combination of the present invention with the device described in U.S. Pat. No. 4,259,606 will result in a very fast warm-up and very low power oven controlled crystal oscillator.

Further, a plurality of resonators may be suspended in a housing(s) by a levitation signal source(s) to form an array of resonators useful in a myriad of applications, such as a thermal imager, a biological/chemical sensors, etc. By levitating the resonators, the resonators are optimally thermally isolated from the remainder of the circuitry and therefore, by utilizing the present invention as a means to thermally isolate a resonator, a highly sensitive thermal imager or a high sensitivity calorimetric biological/chemical sensor can be made. Methods of incorporating a thermally isolated resonator in an thermal imaging array is more fully described in co-pending U.S. patent application Ser. No. 08/397,698, filed Mar. 1, 1995, entitled, "High Sensitivity Temperature Sensor and Sensor Array," and having an attorney docket number CECOM-5031, which is incorporated herein by reference hereto. Therefore, by utilizing the present invention in combination with the above mentioned patent application, such a highly sensitive thermal imager may be formed.

Other and different approximations to the resonator may occur to those skilled in the art. Accordingly, having shown and described what is at present considered to be a single preferred embodiment of the invention, it should be understood that the same has been shown by way of illustration and not limitation. For example, any number of BVA type/electrodeless configuration can be coupled with a myriad of different LC resonant circuit configurations. Therefore, all modifications, alterations, and changes coming within the spirit and scope of the invention are herein meant to be included within the scope of the appended claims.

What is claimed is:

1. A resonator circuit comprising:

a crystalline resonator having an active resonating region;

means to levitate the resonator comprising an inductance/capacitance (LC) resonant circuit having at least two electrodes separated from one another and a third electrode mounted on the resonator outside the active region of the resonator, the LC circuit having a natural frequency; and means to excite the resonator for producing a signal at a predetermined frequency, wherein the means to excite the resonator is coupled to the resonator in an electrodeless configuration.

2. The resonator of claim 1 wherein the means to levitate the resonator comprises a housing having a cavity therein, at least two levitation electrodes mounted on a surface of the cavity, at least one resonator levitation electrode mounted on the resonator outside of the active region, wherein the at least two levitation electrodes are mounted on the surface of the cavity adjacent to the resonator levitation electrode, and a levitation signal source electrically connected to the two levitation electrodes.

3. The resonator of claim 2 wherein the two levitation electrodes are ring shaped and are mounted such that there is a gap between the two levitation electrodes.

4. The resonator of claim 3 wherein the resonator levitation electrode is ring shaped and is mounted outside of an active region of the resonator.

5. The resonator of claim 2 wherein the levitation signal source comprises at least one inductor electrically connected to the two levitation electrodes and an levitation signal source, wherein the resonator levitation electrode, the two levitation electrodes, the inductor and the levitation signal source form the LC resonant circuit and wherein the levitation signal source provides a voltage to the two levitation electrodes at frequency which is greater than the natural frequency of the LC resonant circuit,wherein the voltage applied to the two levitation electrodes does not effect the active region of the resonator.

6. The resonator of claim 1 wherein the means to excite the resonator includes at least one pair of electrodes which are mounted on the surface of the cavity over the active region of the resonator and which do not contact the resonator.

7. The resonator of claim 6 wherein the means to excite the resonator includes at least one lateral field electrode.

8. The resonator of claim 1 wherein in the resonator is circular and biconvex.

9. The resonator of claim 1 wherein the resonator is of shape selected from the group of shapes comprising plano-convex, plano-plano, and rectangular.

10. The resonator of claim 1 wherein the resonator is formed from a material selected from the group of materials comprising quartz, langasite, lithium tetraborate, lithium tantalate and sapphire.

11. The resonator of claim 1 further comprising bumpers attached to the cavity.

12. The resonator of claim 11 wherein the bumpers are attached to the cavity so as to not touch the active region of the resonator.

13. The resonator of claim 11 wherein the bumpers are micromechanical springs.

14. A resonator array comprising:

a plurality of crystalline resonators each having an active resonating region;

means to levitate the resonators comprising at least one inductance/capacitance (LC) resonant circuit having at least two electrodes separated from one another and a third electrode mounted on each of the resonators outside the active region of the resonators, the LC circuit having a natural frequency; and means to excite the resonators for producing a signal at a predetermined frequency wherein the means to excite the resonator is coupled to the resonator in an electrodeless configuration.

15. A resonator circuit comprising:

a crystalline resonator having an active region;

an oscillator circuit electrically coupled to the resonator in an electrodeless fashion so as to excite the resonator at predetermined oscillator frequency;

LC resonant circuit including at least two ring electrodes mounted on a cavity in which the resonator is placed, said ring electrodes being mounted on the cavity at a position which is outside of the active region of said resonator; and a ring resonator electrode mounted on the resonator outside of the active region and adjacent to the two ring electrodes; and means to divide down the oscillator frequency to a frequency greater than a natural frequency of the LC resonant circuit means, said dividing means being electrically connected to the LC resonant circuit so as to levitate the resonator within the cavity.

16. A resonator comprising:

a resonator plate having a top and a bottom surface, an active region, an outer inactive region, and a bridge region which is sandwiched between the active region and the outer inactive region;

at least two ring shaped resonator levitation electrodes, one resonator levitation electrode being mounted on the top surface of the resonator plate and one being mounted on the bottom surface of the resonator plate and both resonator levitation electrodes being mounted on the outer inactive region of the resonator;

a housing having a cavity therein, the cavity having top and bottom portions;

at least two sets of two ring shaped levitation electrodes one set of levitation electrodes being mounted on the top portion of the cavity and one set of levitation electrodes being mounted on the bottom portion of the cavity wherein the two sets of levitation electrodes are disposed in juxtaposition with the resonator levitation electrodes;

an levitation signal source electrically connected to the two sets of levitation electrodes, wherein the two sets of levitation electrodes, the two resonator levitation electrodes, and the levitation signal source form a LC resonant circuit and wherein the levitation signal source levitates the resonator by applying a voltage to the two sets of levitation electrodes at a frequency greater than a natural frequency of the LC resonant circuit; and means to electrically excite the resonator plate.

17. The resonator circuit of claim 16 wherein the means to electrically excite the resonator plate includes at least two electrodes, one electrode being mounted on the top portion of the cavity and one electrode being mounted on the bottom portion of the cavity wherein the electrodes are mounted juxtaposed to the active region of the resonator; and means to apply voltage to the two electrodes.

* * * * *